United States Patent [19]
Bergman

[11] Patent Number: 5,223,801
[45] Date of Patent: Jun. 29, 1993

[54] CRYSTAL OSCILLATOR AND TRANSMITTER OPERATING AT THE THIRD HARMONIC OF THE FIFTH OVERTONE OF A CRYSTAL

[75] Inventor: John Bergman, Ham Lake, Minn.
[73] Assignee: Interactive Technologies, Inc., North St. Paul, Minn.
[21] Appl. No.: 860,152
[22] Filed: Mar. 30, 1992
[51] Int. Cl.⁵ .......................... H03B 5/36; H03C 1/42; H04L 27/02
[52] U.S. Cl. ................................. 331/76; 331/116 R; 332/178; 455/108; 455/118; 455/129
[58] Field of Search ........ 331/76, 77, 116 R, 116 FE, 331/158; 332/172, 174, 178; 455/108, 118, 129

[56] References Cited
U.S. PATENT DOCUMENTS
4,864,636  9/1989  Brunius ........................ 331/116 R X Primary Examiner—Siegfried H. Grimm
Attorney, Agent, or Firm—Douglas L. Tschida

[57] ABSTRACT

An improved short distance, battery powered, amplitude modulated RF transmitter for transmitting encoded security data. An oscillator stage provides a control crystal and filter which are feedback coupled between the emitter and base of a transistor to oscillate at the fifth overtone of the fundamental crystal frequency. A filter tuned to the third harmonic of the overtone frequency selects the carrier frequency which is coupled via a resistive attenuator to an amplifier/filter stage, before the carrier is amplitude modulated with encoded security data. The improved transmitter circuit compensates for crystals exhibiting variations in series resistance and provides increased output power and improved frequency stability to temperature and over time. A foil antenna stage is augmented with the plates of the battery power supply to further improve performance.

9 Claims, 4 Drawing Sheets 5,223,801

CRYSTAL OSCILLATOR AND TRANSMITTER OPERATING AT THE THIRD HARMONIC OF THE FIFTH OVERTONE OF A CRYSTAL

BACKGROUND OF THE INVENTION

The present invention relates to telemetered security systems and, in particular, to a crystal controlled transmitter for transmitting binary, pulse position encoded security data from distributed locations about secured premises to a system controller or central processing unit (CPU).

In partial response to changing emission standards set by cognizant regulatory authorities, a fifth overtone crystal oscillator and transmitter was previously developed for the present assignee for use in communicating security alarm data. This transmitter is described in U.S. Pat. No. 4,864,636, entitled Crystal Controlled Transmitter. The present invention comprises an improvement to that transmitter and, particularly, a lower cost oscillator circuit having improved frequency stability and output power, with fewer reactive components.

Although the oscillator circuit of the foregoing transmitter has been successfully used for some time, a frequently recurring difficulty arises from an inability to obtain uniform crystals from vendors which exhibit relatively low excess series resistance (ESR) values. That is, for the circuit to operate at the preferred frequency of 319.5 MHz, preferably an ESR of less than 30–40 OHMS is desired. Unfortunately, such values are difficult to obtain from crystal vendors.

Crystals which operate outside of these parameters either cause the oscillator stage to not work at all or to oscillate at frequencies other than the desired frequency. The use of reactive components within the collector path of the oscillator path have also demonstrated a sensitivity of the circuitry to the physical arrangement of the components on a printed circuit board and within the transmitter package. Accordingly, efforts have been made to develop an improved circuit which is less sensitive to variations in the ESR value of the crystal and to the physical arrangement of the circuitry. Additional efforts have been made to reduce the component count and number of reactive components and to improve the temperature sensitivity and output power capabilities of the oscillator. Such goals are attained with the circuitry of the present invention.

SUMMARY OF THE INVENTION

Accordingly, it is a primary object of the invention to provide a crystal controlled, RF transmitter circuit which produces a stable, narrow band frequency output without undue emissions.

It is another object of the invention to provide a crystal oscillator circuit which produces a third harmonic carrier frequency from a fifth overtone of the fundamental crystal frequency and which is relatively insensitive to variations in the ESR value of the crystal.

It is another object of the invention to provide an oscillator circuit requiring relatively few frequency reactive components.

It is another object of the invention to provide circuitry which is less sensitive to the physical arrangement of the circuit components and may be compactly packaged to permit inconspicuous mounting in relation to a security transducer, which may also be incorporated therein.

It is another object of the invention to provide a transmitter circuit which requires relatively low current to operate, which exhibits fewer harmonic and parasitic oscillations and which provides improved output power.

It is a further object of the invention to provide a circuit which actively utilizes a transmitter battery supply as part of the antenna stage.

These and various other objects and advantages are achieved within the improved crystal controlled transmitter circuit disclosed herein. The transmitter is particularly useful for transmitting pulse position encoded security data as an amplitude modulated RF output at a 319.5 MHz carrier frequency.

In its preferred construction, the transmitter includes a crystal controlled oscillator which provides stable fifth overtone oscillation at 106.5 MHz from a 21.13 MHz crystal and from which a third harmonic carrier frequency of 319.5 MHz is derived. In other constructions using different crystals, other stable carrier frequencies are obtainable. The oscillator stage includes a crystal which is feedback coupled via a tunable filter between the base and emitter of an associated transistor. The oscillator stage, in turn, is coupled via a resistive attenuator to an amplifier stage.

Encoded binary data is coupled to the amplifier stage where the data is amplitude modulated at the carrier frequency before being coupled to another filter and an improved antenna stage. The antenna stage comprises a foil antenna element which incorporates the plates of a battery power supply into the signal transmission path.

The above objects, advantages and distinctions, as well as others, along with the detailed construction of the invention, will be described in detail hereinafter with respect to the appended drawings. The description should not however be interpreted in limitation of the scope of the invention which instead should be interpreted within the scope of the appended claims. To the extent various modifications have been considered, they also are described as appropriate.

DESCRIPTION OF THE PREFERRED EMBODIMENT

Figure 1:
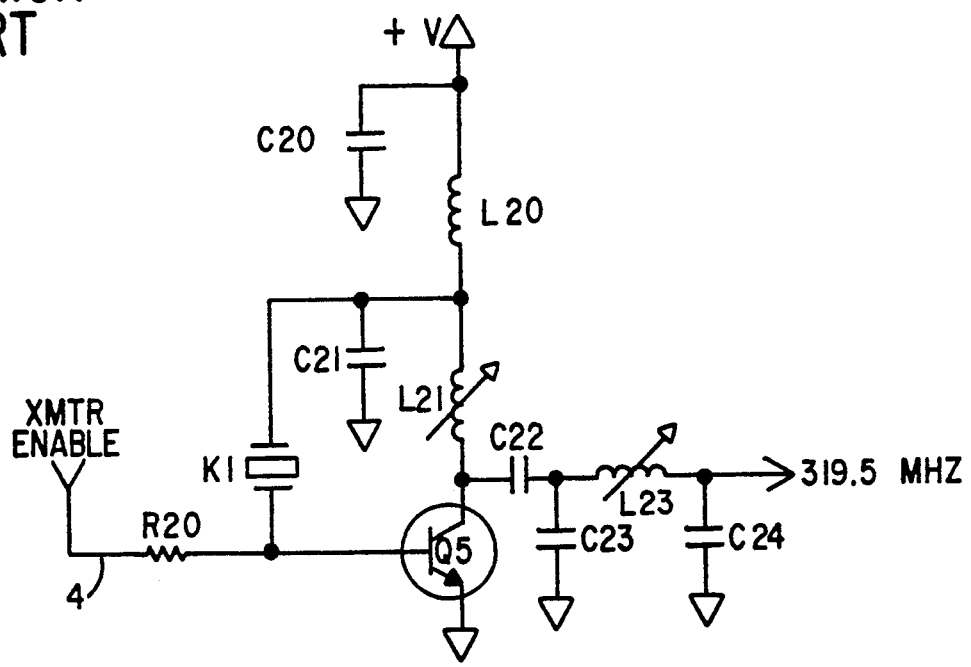
FIG. 1 is a schematic diagram of a prior art fifth overtone crystal controlled oscillator.

Turning attention to FIG. 1, a schematic diagram is shown of a prior art crystal oscillator and security transmitter of the present assignee which is disclosed and described in U.S. Pat. No. 4,864,636. The oscillator of that transmitter provides a feedback path between the collector and base of an associated transistor which augments a fifth overtone frequency of the fundamental crystal frequency. The third harmonic of the augmented frequency is then selected as the carrier frequency. The particular details of the circuit organization and operation are described therein and for the interested reader, attention is directed thereto.

Figure 2:
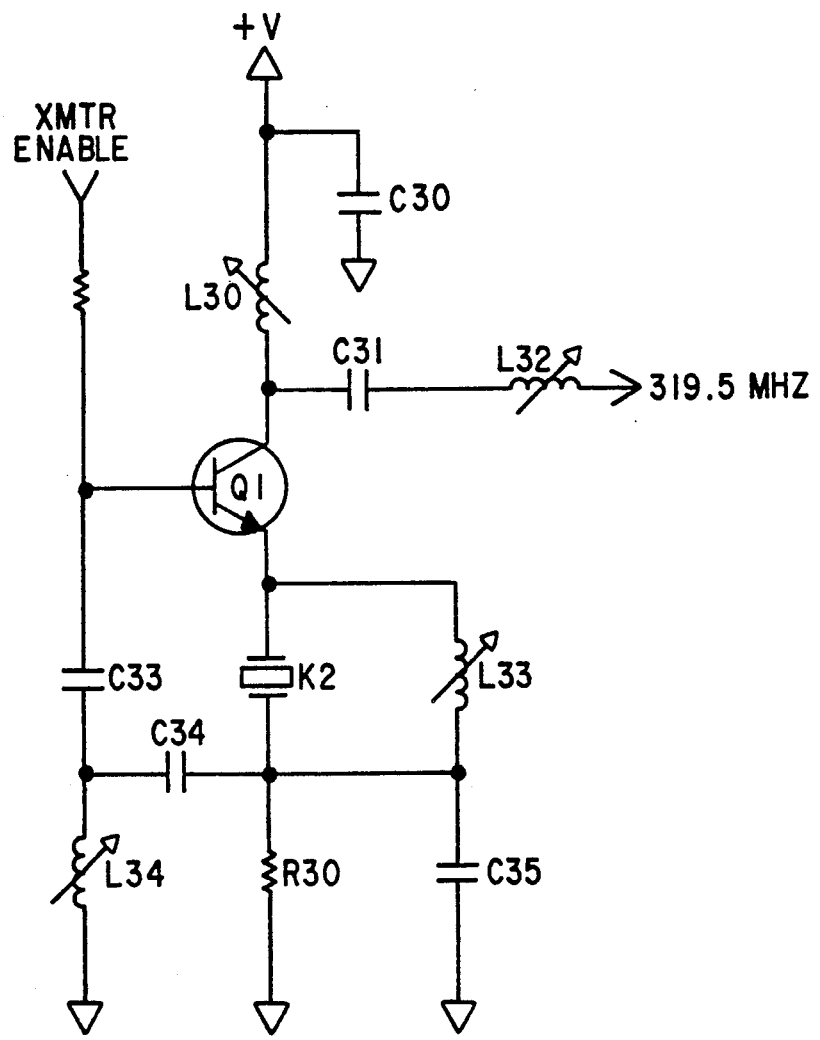
FIG. 2 is a schematic diagram of an alternative prior art fifth overtone crystal controlled oscillator.

FIG. 2 discloses a construction of another fifth overtone crystal oscillator which has been used by the present assignee. An emmiter to base crystal coupling is provided with the latter circuit.

Although the circuits of FIGS. 1 and 2 have provided satisfactory operation, experience has shown the oscillator circuits to be sensitive to variations in the excess series resistance (ESR) value of the crystals K1 and K2 which are used with the circuits. The use of the reactive inductors L20 and L21 within the collector path and L30 and L33 within the emitter path and elsewhere within the circuits have also demonstrated a sensitivity of the circuits to physical layout. That is, depending upon the physical positioning of circuit elements to one another and the tolerances maintained by component vendors, the circuits may not perform as designed. The circuits may in fact not oscillate at all or may oscillate at undesired frequencies.

Figure 3:
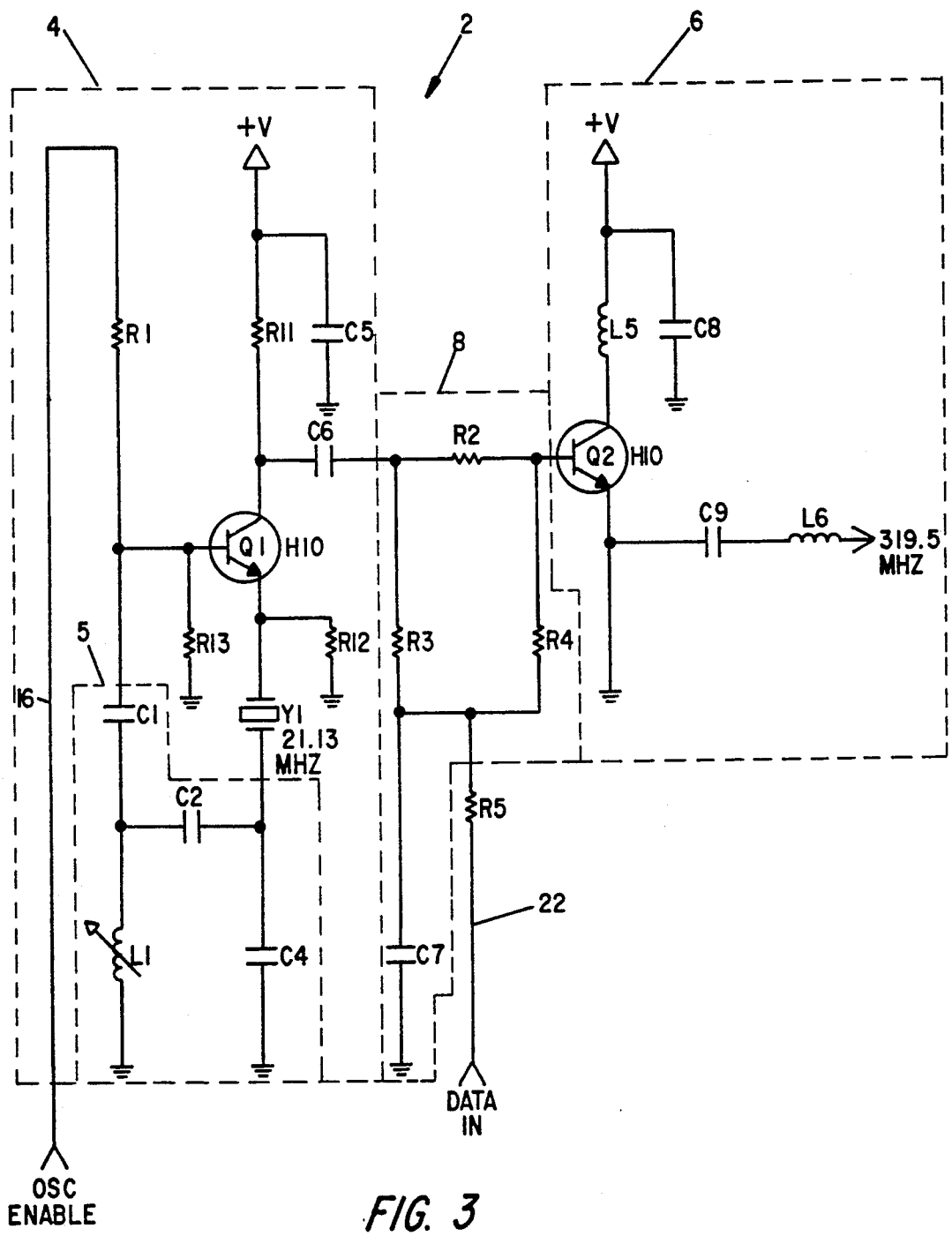
FIG. 3 is a schematic diagram of an improved fifth overtone crystal oscillator with amplifier.
Figure 4:
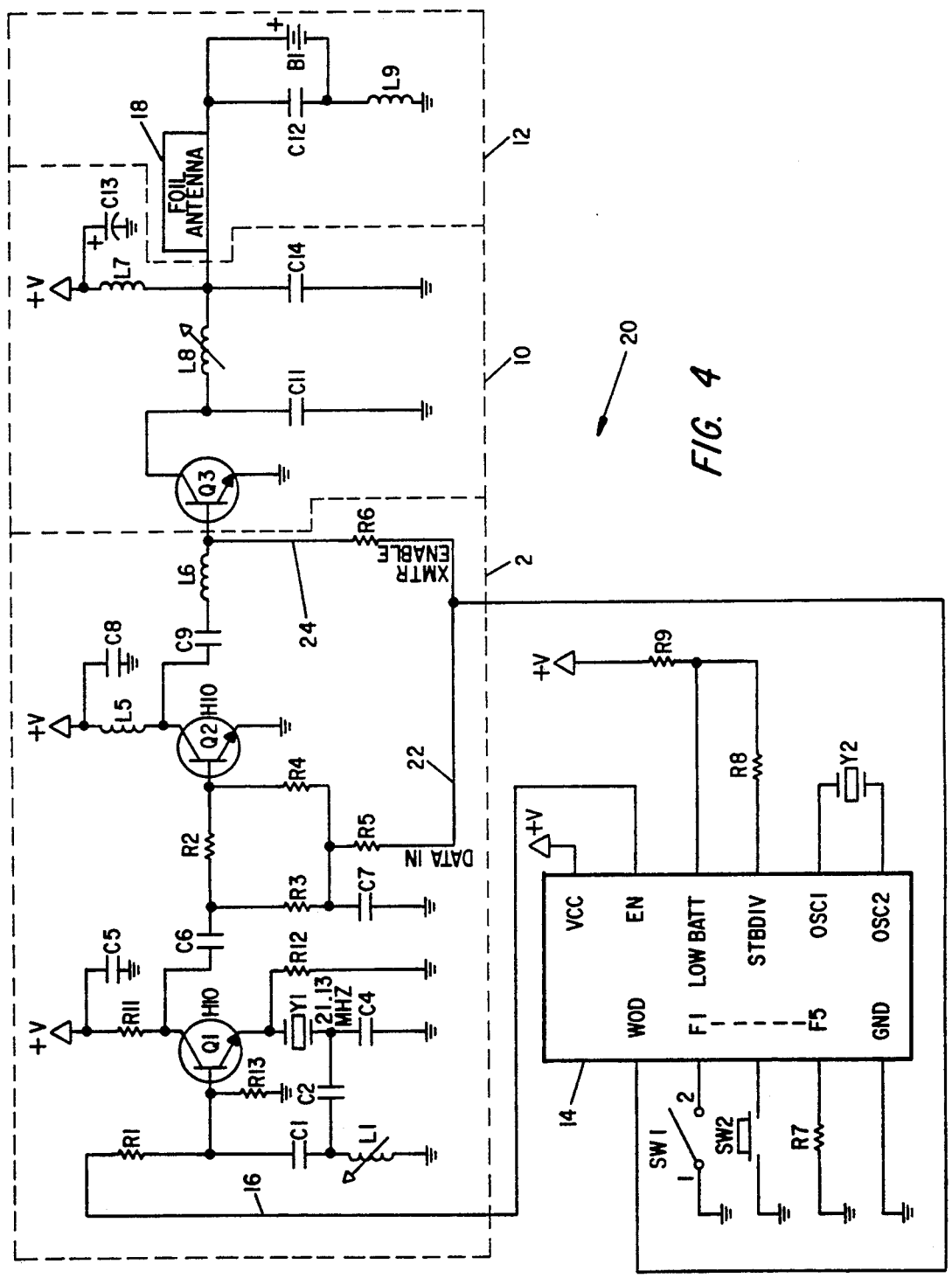
FIG. 4 is a schematic diagram of an RF transmitter including the improved circuit of FIG. 3.

The prior circuits have also demonstrated a narrower range of temperature sensitivity than desired, as well as a sensitivity to component aging. Accordingly, Applicant has developed an improved oscillator and associated transmitter circuit for the use in a short range security alarm environment. A schematic of the improved oscillator circuit 2 is shown at FIG. 3, while the more comprehensive transmitter circuit 20 is shown at FIG. 4. The oscillator circuit 2 of FIGS. 3 and 4 has been designed to reduce the number of reactive elements within the circuit, which not only reduces the circuit cost, but also provides a greater tolerance of the circuit to varieties of physical mountings of the components and transmitter circuitry.

The circuit 2 is generally comprised of an oscillator stage 4 and an amplifier stage 6 which are isolated by a resistive attenuator stage 8. The oscillator stage 4 is constructed around transistor Q1 and crystal Y1, while the amplifier stage 6 is constructed around transistor Q2. The transmitter 20 of FIG. 4, otherwise, adds an antenna amplifier/filter matching stage 10, an antenna stage 12 and a transmitter controller 14 to the oscillator 2. Table I sets forth exemplary values of the circuit components used with the foregoing circuitry for the particular frequencies of the present security alarm application.

TABLE I

| Device | Value |
| --- | --- |
| R1 | 4.7K ohms |
| R2 | 18 ohms |
| R3,R4 | 300 ohms |
| R5 | 20K ohms |
| R6 | 10K ohms |
| R7 | 510K ohms |
| R8 | 536K ohms |
| R9 | 604K ohms |
| R11 | 150 ohms |
| R12 | 270 ohms |
| R13 | 2.4K ohms |
| C1,C14 | 10 PF |
| C2 | 22 PF |
| C4 | 27 PF |
| C5 | .001 UF |
| C6 | 12 PF |
| C7,C8 | 220 PF |
| C9 | 1.2 PF |
| C11 | 47 PF |
| C12 | 100 PF |
| C13 | .047 F |
| L1 | 4.5 T |
| L5 | 100 NHY |
| L6 | 120 NHY |
| L7,9 | 220 NHY |
| L8 | 1.5 T |
| Q1,Q2 | ZETEX H10 |
| Q3 | NE85633 |

TABLE I-continued

| Device | Value |
| --- | --- |
| Y2 | 32 KHZ |
| Y1 | 21.13 MHZ |

Referring to the oscillator stage 4, the feedback path of the oscillator, which determines the fundamental frequency, comprises a 21.136 MHz crystal Y1 and a reactive filter network 5 which are coupled between the emitter and base of the transister Q1. This arrangement enhances the fifth overtone of the fundamental frequency. This basic rearrangement also provides lower powered operation, with less potential for parasitic oscillation, and stabilizes the collector current.

Previously, the inclusion of reactive elements in the collector path of the circuits of FIGS. 1 and 2 produced routing problems for the transmitter power conductors. That is, the inherent inductance of the power conductors taken with the inductors L20, L21 and capacitor C20 of FIG. 1 and the inductor L30 and capacitor C30 of FIG. 2 could produce undesired resonance and upset the oscillator. The shunt inductor L33, capacitor C35 and resistor R30 of the emitter coupled crystal of FIG. 2, otherwise, also provided AC gain to all frequencies, which resulted in numerous parasitic oscillations.

With reduced collector current, however, the operation of the oscillator stage 4 becomes less sensitive to fluctuations in collector current and more a function of the beta of transistor Q1. The resistive network of R1, R2, and R3 particularly provides a more stable bias point which reduces fluctuations in $I_c$ due to beta variations. Any undesired resonance at the lower power levels is also less likely to disrupt the oscillator.

The effects of conductor routing are also minimized via the addition of a collector resistor R11, which decues the oscillator stage 4 relative to a bypass capacitor C5 so the circuit is less likely to oscillate with any parasitic resonance which may develop at the collector.

The crystal Y1, which has a fundamental resonant frequency of 21.13 MHz, and the filter network 5, which is comprised of capacitors C1, C2, C4 and tunable inductor L1, determine the fundamental frequency of operation of the oscillator stage 4 and an enhanced fifth overtone. Although described with respect to a particular crystal frequency, it is to be appreciated the ciruitry of the invention can be used equally well with crystals having other fundamental frequencies. For example, transmitters operating at frequencies of 317.0, 319.0, and 319.4 MHz have also been constructed for certain applications. AC gain also only occurs at the fifth overtone of the crystal, due to the above-mentioned modifications over the circuit of FIG. 2.

The filter network 5, otherwise, provides a relatively high Q value which is established from the composite impedance of the reactive elements. Although, a high Q value is desired to provide a sharper or more narrow band filter at the desired frequency of 105.67 MHz, too high a Q value or too narrow a frequency band can effect oscillator operation with component aging. Thus, the above component values have been selected to accommodate typically encountered differentials in component values between vendors, production tolerances and component aging. A wider frequency band results with reduced sensitivity of the oscillator stage 4 to variations in the operating characteristics of the transistors Q1 and Q2, if supplied by different vendors.

The operation of the oscillator stage 4 is enabled via a control signal on conductor 16 from the integrated transmitter control circuit 14 shown at FIG. 4. The voltage level of the enable signal is determined in relation to the voltage divider comprised of resistors R1 and R13 and biases the operating point of transistor Q1 to a desired oscillator temperature range of −10 to 110 degree Farenheit and aging characteristics.

The desired third harmonic, carrier frequency of 319.5 MHz is otherwise selected by a filter capacitor C6 and coupled to the amplifier stage 6 at the base of transistor Q2. The amplifier stage 6 is comprised of transistor Q2, inductor L5 and capacitor C8, along with a coupling filter comprised of capacitor C9 and inductor L6. The amplifier stage 6 is required to offset the reduced output power obtainable with the oscillator stage 4.

Although requiring an additional transistor, the inclusion of the amplifier stage provides 3 to 5 db more power than attainable with the prior oscillator stages of FIGS. 1 and 2. The necessity of an additional transistor is also offset by the advantages gained from a less reactive oscillator stage 4. The additional power available to the carrier frequency additionally provides improved harmonic performance, since it is not as critical to filter out-of-band harmonics.

The amplifier stage 6, otherwise, is separated from the oscillator stage 4 via a 3 db resistive attenuator 8. The attenuator 8 comprises resistors R2, R3 and R4 which are arranged to isolate the amplifier stage 6 from the oscillator stage 4. That is, any signal reflections at the base of transistor Q2 are subjected to a 6 db loss before returning. Reflections due to the input data therefore do not effect either the base of transistor Q2 or the operation of the oscillator stage 4, which is shielded by the attenuator stage 8 and like the amplifier stage 6 merely sees a 50 ohm path.

The relative stability provided by the attenuator stage 8 also permits the use of a bypass capacitor C7 at the data input, which provides a ground path to any undesired RF signals.

The coupling capacitor C9 and inductor L6, lastly filter the amplitude modulated output of the amplifier stage 6, much in the fashion as the capacitor C7 and tunable inductor L5 in the circuit of FIG. 1 and the capacitor C31 and tunable inductor L32 of the circuit of FIG. 2. Although some power loss can occur through the use of a fixed inductor L6, because 3 to 5 db more power is available, problems have not been encountered. A surface mount inductor L6 may also be used, which has an inherently tighter tolerance and which is relatively insensitive to circuit layout.

With additional attention to FIG. 4, the resistors R5 and R6, respectively couple the relevant data and transmitter enable signals to the base of transistors Q2 and Q3. The transmitter enable signal biases transistor Q3 at the amplifier/filter antenna matching stage 10 into conduction, while data is simultaneously amplitude modulated with the carrier frequency at transistor Q2. The resultant RF signal is passed via transistor Q3 to the filter network including tunable inductor L8 and capacitor C11, which operate in essentially the same fashion as in the prior circuit.

Although generally described in the prior patent, the integrated sensor controller 14 operates in relation to a separate 32 kHz crystal Y2, which provides appropriate clock or timing signals. The controller 14 includes necessary logic circuitry for coupling alarm conditions which appear at the inputs F1 to F5 and, in particular, the alarm switch SW1 or tamper switch SW2 at the transmitter enclosure. The other available input ports F3 through F5, accomodate other alarm inputs, but are merely vacant for the circuit shown.

Provisions are also made at the controller to accept specific binary identification data descriptive of the security system and the particular sensors or switches to which it is assigned. Along with identification data, each sensor transmitter 2 may also be programmed with various preconditioning options peculiar to the specific transducer or swith type to which it is coupled and relative to which the sensed inputs are processed to determine valid alarm (i.e. violation) and restore conditions.

Upon the detection of predetermined conditions, the controller 14 produces a "data in" signal (i.e. a pulse position encoded binary message wherein each pulse of each data frame identifies two bits of binary data) on conductor 22, which along with a "transmitter enable" signal on conductor 24, causes the transmitter 20 to transmit a corresponding amplitude modulated signal at 319.5 MHz to the system controller by way of the antenna 18.

Low battery test circuitry is also included which compares a voltage developed by the battery supply B1 over a voltage divider comprised of resistors R8 and R9 to an internally developed reference voltage. If the battery 15 voltage compares low, the controller 14 transmits data indicative of the low battery condition to the transmitter 20 and the central controller (not shown). The enable port otherwise produces a control signal which enables the oscillator stage 2, shortly before the transmission of the data, and provides time for the oscillator 2 to "warm up".

With attention lastly directed to the antenna circuitry 12, a foil antenna 18 is provided at the transmitter 20 which is actively coupled to the plates of the battery B1. Because various battery manufacturers alternate the position of the positive and negative plates relative to the exterior of the battery, a capacitor C12 is provided to appropriately compensate for the alternative plate positionings. Whichever plate is positioned at the outside of the battery thereby appropriately radiates the RF signal.

While the invention has been described with respect to its presently preferred construction, it is to be appreciated the circuits might be modified by those skilled in the art. The following claims should therefore be interpreted to include all those equivalent constructions within the spirit and scope thereof.

What is claimed is:

1. An oscillator comprising:
   a) a transistor having a base, emitter and collector;
   b) means for biasing said transistor to conduction;
   c) a crystal resonant at a fundamental frequency coupled at one end to said emitter and at an opposite end to means for producing resonance and AC gain at a fifth overtone frequency of said fundamental frequency of said crystal; and
   d) harmonic extraction means coupled to said collector for extracting a carrier frequency at a harmonic of said fifth overtone frequency from said oscillator.

2. Apparatus as set forth in claim 1 wherein a third harmonic carrier frequency is extracted and including means for amplifying and modulating the third harmonic carrier frequency with encoded data and coupling the modulated third harmonic carrier frequency to antenna means for transmission.

3. Apparatus as set forth in claim 2 including a second transistor having a base, emitter and collector and first, second and third resistors, wherein one end of the first resistor is coupled to the harmonic extraction means and one end of the second resistor and an opposite end of the first resistor is coupled to the base of the second transistor and one end of the third resistor, and wherein the opposite ends of the second and third resistors are coupled to the encoded data.

4. Apparatus as set forth in claim 1 wherein said resonance producing means comprises first, second and third capacitors and an inductor, wherein each of said first and second capacitors are coupled at one end to the opposite end of said crystal, wherein the opposite end of the first capacitor is coupled to a reference voltage and the opposite end of the second capacitor is coupled to one end of the third capacitor and the inductor, and wherein an opposite end of the inductor is coupled to the reference voltage and an opposite end of the third capacitor is coupled to said base.

5. Apparatus as set forth in claim 2 including means for applying power to said base in anticipation of receipt of said encoded data.

6. Apparatus as set forth in claim 2 wherein said antenna means includes a storage battery which powers said oscillator apparatus and wherein ones of a plurality of plates of the storage battery are coupled in series resonance with the antenna.

7. An oscillator comprising:
a) a transistor having a base, emitter and collector;
b) means for biasing said transistor to conduction;
c) a crystal resonant at a fundamental frequency coupled at one end to said emitter and at an opposite end to means for producing resonance and AC gain at a fifth overtone frequency of said fundamental frequency of said crystal; and
d) means coupled to said collector for extracting a carrier frequency at a third harmonic of said fifth overtone frequency from said oscillator;
e) antenna means; and
f) means coupled to the carrier frequency for amplifying and modulating the carrier frequency with encoded security data and coupling the modulated carrier frequency to said antenna means for transmission.

8. A transmitter comprising:
a) first and second transistors, each having a base, emitter and collector;
b) means for biasing said first and second transistors to conduction;
c) a crystal resonant at a fundamental frequency coupled at one end to the emitter of said first transistor and at an opposite end to first and second capacitors, wherein the opposite end of the first capacitor is coupled to a reference voltage and the opposite end of the second capacitor is coupled to one end of a third capacitor and one end of an inductor, and wherein an opposite end of the inductor is coupled to the reference voltage and an opposite end of the third capacitor is coupled to the base of said first transistor, whereby resonance and AC gain are produced at a fifth overtone frequency of said fundamental frequency of said crystal;
d) means coupled to said collector for extracting a carrier frequency at a third harmonic of said fifth overtone frequency from said oscillator and including first, second and third resistors, wherein one end of the first resistor is coupled to one end of a fourth capacitor having an opposite end coupled to the collector of the first transistor and one end of the second resistor and an opposite end of the first resistor is coupled to the base of the second transistor and one end of the third resistor, and wherein the opposite ends of the second and third resistors are coupled to means providing encoded data, whereby the carrier frequency is amplitude modulated with the encoded data;
e) antenna means; and
f) means coupled to said second transistor for amplifying and coupling the modulated carrier frequency to said antenna means for transmission.

9. Apparatus as set forth in claim 8 wherein said antenna means includes a storage battery which powers said oscillator apparatus and wherein ones of a plurality of plates of the storage battery are coupled in series resonance with the antenna.

* * * * *